United States Patent
Lee et al.

(10) Patent No.: US 7,181,181 B2
(45) Date of Patent: Feb. 20, 2007

(54) MULTI-BAND TRANSCEIVER FOR A WIRELESS COMMUNICATION SYSTEM

(75) Inventors: Han-Il Lee, Hwaseong-si (KR); In-chul Hwang, Seoul (KR)

(73) Assignee: Samsung Electronics Co., Ltd. (KR)

(*) Notice: Subject to any disclaimer, the term of this patent is extended or adjusted under 35 U.S.C. 154(b) by 347 days.

(21) Appl. No.: 10/967,386

(22) Filed: Oct. 18, 2004

(65) Prior Publication Data
US 2005/0085206 A1    Apr. 21, 2005

(30) Foreign Application Priority Data
Oct. 17, 2003    (KR) ...................... 10-2003-0072497

(51) Int. Cl.
*H04B 1/06* (2006.01)
*H04B 7/00* (2006.01)

(52) U.S. Cl. .......................... 455/260; 455/76; 455/80; 455/165.1; 455/86; 455/118; 455/112; 455/180.3; 331/17; 331/57; 331/108 B; 381/173; 381/114; 327/147; 327/156; 327/105

(58) Field of Classification Search ............. 455/552.1, 455/86, 80, 118, 180.3, 260, 112, 165.1; 331/108 B; 327/147, 156, 105
See application file for complete search history.

(56) References Cited

U.S. PATENT DOCUMENTS

| | | | |
|---|---|---|---|
| 6,147,525 A * | 11/2000 | Mitani et al. ............... | 327/119 |
| 6,150,890 A | 11/2000 | Damgaard et al. ............ | 331/14 |
| 6,308,049 B1 | 10/2001 | Bellaouar et al. ............ | 455/76 |
| 6,566,964 B1 * | 5/2003 | Hirano ........................ | 331/1 A |
| 6,728,526 B2 * | 4/2004 | Yamada et al. ............. | 455/260 |
| 6,868,261 B2 * | 3/2005 | Shi et al. .................. | 455/114.2 |
| 6,870,409 B2 * | 3/2005 | Lee ............................. | 327/147 |
| 6,914,935 B2 * | 7/2005 | Eklof .......................... | 375/238 |

FOREIGN PATENT DOCUMENTS

EP    1 113 584    4/2001
WO    WO 01/17124    8/2001

* cited by examiner

*Primary Examiner*—Marceau Milord
(74) *Attorney, Agent, or Firm*—F. Chau & Associates, LLC

(57) ABSTRACT

A local oscillation signal generator and a multi-band transceiver including the local oscillation signal generator are provided. The multi-band transceiver includes a fractional-N phased locked loop (PLL), a local oscillation signal generator, and a transmitter. The fractional-N PLL receives a reference signal and outputs an oscillation signal that is phase-locked to the reference signal. The local oscillation signal generator receives the oscillation signal and outputs a first divided signal that is obtained by dividing a frequency of the oscillation signal by a first value and a second divided signal that is obtained by dividing the frequency of the oscillation signal by a second value. The transmitter receives input signals and generates a transmitter signal using an equation $$f_{TX} = \left(\frac{2}{3k} - \frac{1}{M}\right) f_{VCO},$$

based on the first divided signal and the second divided signal.

19 Claims, 1 Drawing Sheet

MULTI-BAND TRANSCEIVER FOR A WIRELESS COMMUNICATION SYSTEM

CROSS REFERENCE TO RELATED APPLICATION

This application claims the priority of Korean Patent Application No. 2003-72497, filed on Oct. 17, 2003, in the Korean Intellectual Property Office, the disclosure of which is hereby incorporated by reference in its entirety.

TECHNICAL FIELD

The present invention relates to a multi-band transceiver, and more particularly, to a multi-band transceiver used in a wireless communication system and a local oscillation signal generator that generates local oscillation signals used in the multi-band transceiver.

DISCUSSION OF THE RELATED ART

A transceiver of a Global System for Mobile communication (GSM) handset includes an offset Phase Locked Loop (PLL) that is also called a frequency translational loop.

The offset PLL can produce different signals having random offsets from a transmitter's local oscillation signal or a receiver's local oscillation signal. However, one of the most problematic issues with the offset PLL is that it generates many spurious signals.

Meanwhile, an application such as GSM or Bluetooth using constant envelope modulation, particularly Gaussian filtered Minimum Shift Keying (GMSK) modulation, frequency-up-converts a baseband signal using the offset PLL.

Since the offset PLL can make an intermediate frequency (IF) range narrower, the amplitude and phase can be very accurately designed when a quadrature modulator is designed.

In the transceiver, a PLL is typically used as a frequency synthesizer to generate local oscillation signals. Recently, a voltage controlled oscillator used in the PLL has been implemented on-chip. To maintain the small size of the VCO, the frequency tuning range of the voltage controlled oscillator should be small.

As the PLL is an application used in General Packet Radio Service (GPRS), a fractional-N PLL has been widely used. A frequency plan in the offset PLL (frequency translational loop) using the fractional-N PLL is designed to simultaneously minimize the frequency tuning range of the voltage controlled oscillator and the IF range while removing the effect of fractional spurious signals.

SUMMARY OF THE INVENTION

A multi-band transceiver that minimizes the frequency tuning range of a voltage controlled oscillator used in a PLL is provided. The multi-band receiver simplifies the design of the voltage controlled oscillator. A local oscillation signal generator that generates local oscillation signals used in the multi-band transceiver is also provided.

According to one aspect of the present invention, a local oscillation signal generator is provided that receives an oscillation signal ($f_{VCO}$) having a predetermined frequency range and generates a local oscillation signal used in a multi-band transceiver based on the received oscillation signal ($f_{VCO}$). The local oscillation signal generator comprises a first frequency divider and a second frequency divider. The first frequency divider divides a frequency of the received oscillation signal ($f_{VCO}$) using $$f_{LO} = \frac{f_{VCO}}{3k}$$

and outputs the frequency-divided signal ($f_{LO}$). The second frequency divider divides a frequency of the received oscillation signal ($f_{VCO}$) using $$f_{IF} = \frac{f_{VCO}}{M}$$

and outputs the frequency-divided signal ($f_{IF}$).

Here, k is equal to 1 in the Digital Cellular System (DCS) and the Personal Communication System (PCS) and equal to 2 in the Global System for Mobile communication (GSM) and the Enhanced GSM (EGSM).

Here, M is equal to 24 or 36 in GSM, equal to 24 or 40 in EGSM, equal to 24 or 16 in DCS, and equal to 12 or 16 in PCS.

The predetermined frequency range of the oscillation signal ($f_{VCO}$) extends from 2190 MHz to 2620 MHz.

According to one aspect of the present invention, a multi-band transceiver is provided that includes a fractional-N phase locked loop, a local oscillation signal generator, a local oscillation signal generator, and a transmitter. The fractional-N phase locked loop receives a reference signal and outputs an oscillation signal that is phase-locked to the reference signal. The local oscillation signal generator receives the oscillation signal and outputs a first divided signal that is obtained by dividing a frequency of the oscillation signal by a first value and a second divided signal that is obtained by dividing the frequency of the oscillation signal by a second value. The transmitter receives input signals and generates a transmitter signal using an equation, based on the first divided signal and the second divided signal, wherein the equation is as follows:

$$f_{TX} = \left(\frac{2}{3k} - \frac{1}{M}\right)f_{VCO},$$

where $f_{TX}$ represents a frequency of the transmitter signal, $f_{VCO}$ represents the frequency of the oscillation signal, 3 k represents the first value, and M represents the second value.

When a frequency of the reference signal is 13 MHz or 26 MHz, the frequency of the oscillation signal ranges from 2190 MHz to 262 MHz.

Here, k is equal to 1 in the Digital Cellular System (DCS) and the Personal Communication System (PCS) and equal to 2 in the Global System for the Mobile communication (GSM) and the Enhanced GSM (EGSM), and M is equal to 24 or 36 in GSM, equal to 24 or 40 in EGSM, equal to 24 or 16 in DCS, and equal to 12 or 16 in PCS.

An output frequency of the transmitter ranges from 824 MHz to 850 MHz in GSM, from 880 MHz to 915 MHz in EGSM, from 1710 MHz to 1785 MHz in DCS, and from 1850 MHz to 1910 MHz in PCS.

A reception frequency of a receiver of the multi-band transceiver ranges from 869 MHz to 895 MHz in GSM, from 925 MHz to 960 MHz in EGSM, from 1805 MHz to 1880 MHz in DCS, and from 1930 MHz to 1990 MHz in PCS.

BRIEF DESCRIPTION OF THE DRAWINGS

Preferred embodiments of the invention are described with reference to the accompanying drawings, of which.

DETAILED DESCRIPTION OF THE INVENTION

Figure 1:
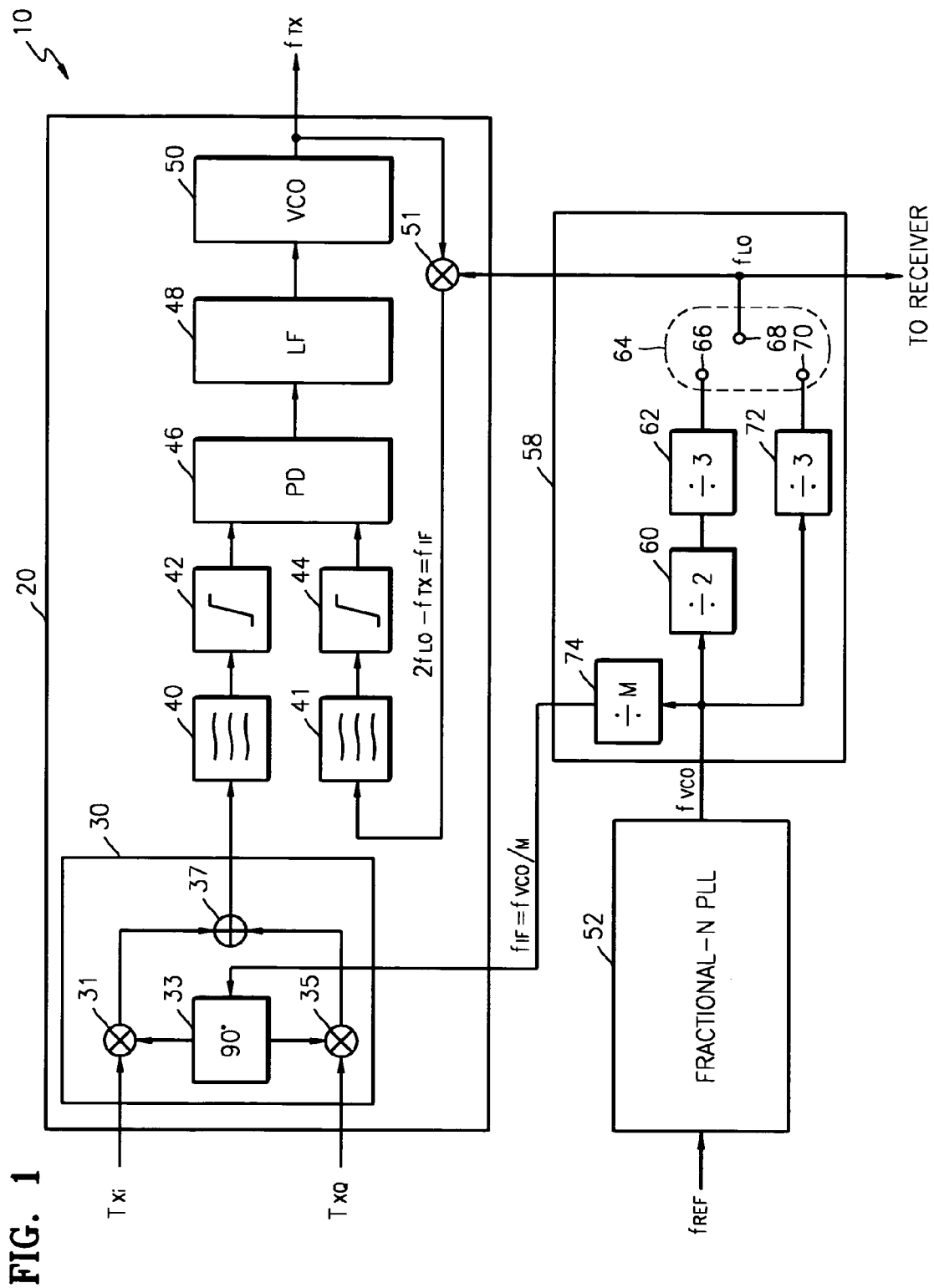
FIG. 1 is a block diagram of a transceiver according to an embodiment of the present invention.

The preferred embodiments of the present invention will be described with reference to the appended drawings.

FIG. 1 is a block diagram of a transceiver 10 according to an embodiment of the present invention. The transceiver 10 may be used in a multi-band wireless communication application such as GSM, Enterprise Global Planning System (EGPS), GPRS, Code Division Multiple Access (CDMA), Wideband CDMA (WCDMA), Digital Cellular System (DCS), Personal Communication System (PCS), or Bluetooth.

The transceiver 10 includes a transmitter 20, a fractional N-PLL (hereinafter, referred to as a FNPLL) 52, and a local oscillation signal generator 58.

The FNPLL 52 receives a reference signal $f_{REF}$ and outputs an oscillation signal $f_{VCO}$ that is phase-locked to the reference signal $f_{REF}$. It is desirable for the frequency of the reference signal $f_{REF}$ to be 13 MHz or 26 MHz. Also, preferably, the frequency of the oscillation signal $f_{VCO}$ that is generated from a voltage oscillated oscillator (not shown) of the FNPLL 52 ranges from 2190 MHz to 2620 MHz.

The local oscillation signal generator 58 includes a switch 64 and a plurality of frequency dividers 60, 62, 72, and 74 for generating local oscillation signals $f_{IF}$ and $f_{LO}$ required for the transmitter 20 and a receiver (not shown).

The frequency divider 60 receives the oscillation signal $f_{VCO}$ output from the FNPLL 52 and divides the frequency of the oscillation signal $f_{VCO}$ by 2. The frequency divider 62 receives an output signal of the frequency divider 60 and divides the frequency of the output signal by 3. The frequency divider 72 receives the oscillation signal $f_{VCO}$ output from the FNPLL 52 and divides the frequency of the oscillation signal $f_{VCO}$ by 3. The plurality of frequency dividers 60, 62, and 72 form a frequency dividing block for generating the local oscillation signal $f_{LO}$.

The switch 64 outputs either an output signal of the frequency divider 62 or an output signal of the frequency divider 72 to the receiver (not shown) and a mixer 51.

The local oscillation signal $f_{LO}$ output from the switch 64 is expressed as follows.

$$f_{LO} = \frac{f_{VCO}}{3k} \quad (1)$$

Based on the local oscillation signal $f_{LO}$ output from the switch 64, a reception frequency of the receiver (not shown) of the transceiver 10 ranges from 869 MHz to 895 MHz in GSM, from 925 MHz to 960 MHz in EGSM, from 1805 MHz to 1880 MHz in DCS, and from 1930 MHz to 1990 MHz in PCS.

In case of DCS or PCS, k is equal to 1. In case of GSM or enhanced GSM (EGSM), k is equal to 2. In DCS/PCS, terminals 68 and 70 of the switch 64 are connected with each other. In GSM/EGSM, terminals 66 and 68 of the switch 64 are connected with each other.

The frequency divider 74 receives the oscillation signal $f_{TX}$ output from the FNPLL 52 and divides the frequency of the oscillation signal $f_{VCO}$ by M (M is a natural number). Here, M varies with an application band (GSM, ESGM, DCS, or PCS). Also, within the same application band, M has two values in consideration of fractional spurious signals. In addition, in order to cause local oscillation signals generated by mixers 31 and 35 to have four different phases, M must be a multiple of 4. M is shown in Table 1.

| Application band | M | |
|---|---|---|
| GSM | 24 | 36 |
| ESGM | 24 | 40 |
| DCS | 16 | 24 |
| PCS | 12 | 16 |

Thus, the local oscillation signal $f_{IF}$ output from the frequency divider 74 is expressed as follows.

$$f_{IF} = \frac{f_{VCO}}{M} \quad (2)$$

The transmitter 20 includes an I-Q modulator 30, band pass filters 40 and 41, limiters 42 and 44, a phase detector 46, a loop filter 48, a voltage controlled oscillator 50, and the mixer 51.

The I-Q modulator 30 includes the two mixers 31 and 35, a phase shifter 33, and an adder 37. It is preferable that each of the mixers 31 and 35 be implemented as a harmonic rejection mixer (HRM) to remove harmonics from the local oscillation signal $f_{IF}$ output from the frequency divider 74. Hereinafter, the mixers 31 and 35 will be referred to as HRMs 31 and 35.

The phase shifter 33 receives the local oscillation signal $f_{IF}$ output from the frequency divider 74, and then shifts the phase of the local oscillation signal $f_{IF}$ by 90°, and outputs a phase-shifted signal to the HRMs 31 and 35.

The HRM 31 receives a first input signal $T_{xi}$ and an output signal of the phase shifter 33, mixes them, and then outputs the result of mixing to the adder 37. The HRM 35 receives a second input signal $T_{xQ}$ and the output signal of the phase shifter 33, and mixes them, and outputs the result of mixing to the adder 37. The first input signal $T_{xi}$ and the second input signal $T_{xQ}$ are 90° out of phase.

The adder 37 receives output signals of the HRMs 31 and 35, adds them, and outputs the result of addition to the band pass filter 40.

It is preferable that the mixer 51 be implemented as a sub-harmonic mixer (SHM) to prevent the local oscillation signal $f_{LO}$ output from the switch 64 from affecting an output signal of the mixer 51. Hereinafter, the mixer 51 will be referred to as a SHM 51.

The SHM 51 receives the oscillation signal $f_{VCO}$ output from the voltage controlled oscillator 50 and the local oscillation signal $f_{LO}$ output from the local oscillation signal generator 58, mixes them, and then outputs the result of mixing, i.e., the local oscillation signal $f_{IF}$, to the band pass filter 41. At this time, the local oscillation signal $f_{IF}$ output from the SHM 51 is expressed as follows.

$$f_{IF} = 2f_{LO} - f_{TX} \quad (3)$$

At this time, the local oscillation signal $f_{IF}$ output from the frequency divider 74 and the local oscillation signal $f_{IF}$ output from the SHM 51 are the same. Thus, referring to Equations 1 through 3, an output signal $f_{TX}$ of the voltage controlled oscillator 50 can be calculated as follows.

$$\frac{f_{VCO}}{M} = 2f_{LO} - f_{TX} \quad (4)$$

$$f_{TX} = \left(\frac{2}{3k} - \frac{1}{M}\right)f_{VCO}$$

Preferably, the frequency of the output signal $f_{TX}$ ranges from 824 MHz to 850 MHz in GSM, from 880 MHz to 915 MHz in EGSM, from 1710 MHz to 1785 MHz in DCS, and from 1850 MHz to 1910 MHz in PCS.

The limiter 42 receives a band pass filtered signal processed by the band pass filter 41 and keeps the received band pass filtered signal within a predetermined range.

The phase detector 46 receives output signals of the limiters 42 and 44, detects a phase difference between the received signals, and outputs the result of detection to the loop filter 48. The loop filter 48 may be implemented as a low-pass filter. The loop filter 48 filters an output signal of the phase detector 46 and outputs the result of filtering to the voltage controlled oscillator 50. The voltage controlled oscillator 50 generates the output signal $f_{TX}$, which is periodic, based on an output voltage of the loop filter 48.

As described above, the multi-band transceiver of a wireless communication system according to the present invention simultaneously minimizes the frequency tuning range of the fractional-N PLL and the IF range, while removing the effect of fractional spurious signals.

While the present invention has been particularly shown and described with reference to an exemplary embodiment thereof, it will be understood by those of ordinary skill in the art that various changes in form and details may be made therein without departing from the spirit and scope of the invention as defined by the appended claims and their equivalents.

What is claimed is:

1. A local oscillation signal generator that receives an oscillation signal having a predetermined frequency range and generates a local oscillation signal used in a multi-band transceiver based on the received oscillation signal, the local oscillation signal generator comprising:
   a first frequency divider, which divides a frequency of the received oscillation signal using a first ratio of a parameter $f_{VCO}$ representing the received oscillation signal and a parameter 3k, and outputs a first frequency-divided signal; and
   a second frequency divider, which divides a frequency of the received oscillation signal ($f_{VCO}$) using a second ratio of the parameter $f_{VCO}$ and a parameter M and outputs a second frequency-divided signal.

2. The local oscillation signal generator of claim 1, wherein the a "k" value of the parameter 3 k is equal to 1 in digital cellular system (DCS) and personal communication system (PCS) and equal to 2 in global system for mobile communication (GSM) and enhanced GSM (EGSM).

3. The local oscillation signal generator of claim 1, wherein the parameter M is equal to at least one of 24 and 36 in GSM, equal to at least one of 24 and 40 in EGSM, equal to at least one of 24 and 16 in DCS, and equal to at least one of 12 and 16 in PCS.

4. The local oscillation signal generator of claim 1, wherein the predetermined frequency range of the received oscillation signal extends from about 2190 MHz to about 2620 MHz.

5. The local oscillation signal generator of claim 1, wherein the first ratio between the parameter $f_{VCO}$ and the parameter 3 k are is given by an equation $$f_{LO} = \frac{f_{VCO}}{3k},$$

wherein the first frequency divided signal is represented as ($f_{LO}$).

6. The local oscillation signal generator of claim 1, wherein the second ratio of the parameter $f_{VCO}$ and the parameter M is given by an equation $$f_{IF} = \frac{f_{VCO}}{M},$$

wherein the second frequency divided signal is represented as ($f_{IF}$).

7. A multi-band transceiver used in a wireless communication system, comprising:
   a fractional-N phase locked loop, which receives a reference signal and outputs an oscillation signal that is phase-locked to the reference signal;
   a local oscillation signal generator, which receives the oscillation signal and outputs a first divided signal that is obtained by dividing a frequency of the oscillation signal by a first value and a second divided signal that is obtained by dividing the frequency of the oscillation signal by a second value; and
   a transmitter, which receives input signals and generates a transmitter signal using a parameter relationship and based on the first divided signal and the second divided signal.

8. The multi-band transceiver of claim 7, wherein the parameter relationship is an equation comprising:

$$f_{TX} = \left(\frac{2}{3k} - \frac{1}{M}\right)f_{VCO},$$

where a parameter $f_{TX}$ represents a frequency of the transmitter signal, parameter $f_{VCO}$ represents the frequency of the oscillation signal, a parameter 3 k represents the first value, and a parameter M represents the second value.

9. The multi-band transceiver of claim 7, wherein when a frequency of the reference signal is 13 MHz or 26 MHz and a frequency of the oscillation signal ranges from about 2190 MHz to about 2620 MHz.

10. The multi-band transceiver of claim 7, wherein the a value "k" of the parameter 3 k is equal to 1 in digital cellular system (DCS) and personal communication system (PCS) and equal to 2 in global system for mobile communication (GSM) and enhanced GSM (EGSM), and M is equal to at least one of 24 and 36 in GSM, equal to at least one of 24 and 40 in EGSM, equal to at least one of 24 and 16 in DCS, and equal to at least one of 12 and 16 in PCS.

11. The multi-band transceiver of claim 7, wherein an output frequency of the transmitter ranges from 824 MHz to 850 MHz in GSM, from 880 MHz to 915 MHz in EGSM, from 1710 MHz to 1785 MHz in DCS, and from 1850 MHz to 1910 MHz in PCS.

12. The multi-band transceiver of claim 11, wherein a reception frequency of a receiver of the multi-band transceiver ranges from 869 MHz to 895 MHz in GSM, from 925 MHz to 960 MHz in EGSM, from 1805 MHz to 1880 MHz in DCS, and from 1930 MHz to 1990 MHz in PCS.

13. A method for generating a local oscillation signal used in a multi-band transceiver and based on a received oscillation signal, the method comprising:
dividing a first frequency of the received oscillation signal using a first ratio of a parameter $f_{VCO}$ representing the received oscillation signal and a parameter 3 k to output a first frequency-divided signal; and
dividing a second frequency of the received oscillation signal using a second ratio of the parameter $f_{VCO}$ representing the received oscillation signal and a parameter M to output a second frequency-divided signal.

14. The method of claim 13, wherein the first frequency divided signal is represented as ($f_{LO}$) and the second frequency divided signal is represented as ($f_{IF}$).

15. The method of claim 13, wherein the a "k" value of the parameter 3 k is equal to 1 in digital cellular system (DCS) and personal communication system (PCS) and equal to 2 in global system for mobile communication (GSM) and enhanced GSM (EGSM).

16. The method of claim 13, wherein the parameter M is equal to at least one of 24 and 36 in GSM, equal to at least one of 24 and 40 in EGSM, equal to at least one of 24 and 16 in DCS, and equal to at least one of 12 and 16 in PCS.

17. The method of claim 13, wherein the predetermined frequency range of the oscillation signal extends from about 2190 MHz to about 2620 MHz.

18. The method of claim 13, wherein the first ratio between the parameter $f_{VCO}$ and the parameter 3 k are is given by an equation $$f_{LO} = \frac{f_{VCO}}{3k},$$

wherein the first frequency divided signal is represented as ($f_{LO}$).

19. The method of claim 13, wherein the second ratio of the parameter $f_{VCO}$ and the parameter M is given by an equation $$f_{IF} = \frac{f_{VCO}}{M},$$

wherein the second frequency divided signal is represented as ($f_{IF}$).

* * * * *